United States Patent
Lee et al.

(10) Patent No.: US 11,624,984 B2
(45) Date of Patent: Apr. 11, 2023

(54) PROCESS LIQUID COMPOSITION FOR EXTREME ULTRAVIOLET LITHOGRAPHY AND PATTERN FORMING METHOD USING SAME

(71) Applicant: YOUNG CHANG CHEMICAL CO., LTD, Gyeongsangbuk-do (KR)

(72) Inventors: Su Jin Lee, Daegu (KR); Seung Hun Lee, Daegu (KR); Seung Hyun Lee, Daegu (KR)

(73) Assignee: YOUNG CHANG CHEMICAL CO., LTD, Gyeongsangbuk-Do (KR)

( * ) Notice: Subject to any disclaimer, the term of this patent is extended or adjusted under 35 U.S.C. 154(b) by 210 days.

(21) Appl. No.: 17/054,023

(22) PCT Filed: May 22, 2019

(86) PCT No.: PCT/KR2019/006118
§ 371 (c)(1),
(2) Date: Nov. 9, 2020

(87) PCT Pub. No.: WO2019/240397
PCT Pub. Date: Dec. 19, 2019

(65) Prior Publication Data
US 2021/0088910 A1   Mar. 25, 2021

(30) Foreign Application Priority Data

Jun. 14, 2018   (KR) ........................ 10-2018-0068033

(51) Int. Cl.
| | | |
|---|---|---|
| C11D 1/66 | (2006.01) | |
| G03F 7/42 | (2006.01) | |
| C11D 1/72 | (2006.01) | |
| C11D 3/30 | (2006.01) | |
| C11D 11/00 | (2006.01) | |
| G03F 7/20 | (2006.01) | |

(52) U.S. Cl.
CPC ................ *G03F 7/425* (2013.01); *C11D 1/72* (2013.01); *C11D 3/30* (2013.01); *C11D 11/0047* (2013.01); *G03F 7/2004* (2013.01)

(58) Field of Classification Search
CPC .................................................. C11D 11/0047
USPC ......................................................... 510/175
See application file for complete search history.

(56) References Cited

U.S. PATENT DOCUMENTS

2007/0010411 A1*   1/2007   Amemiya ........... C11D 11/0047
                                                          510/175

FOREIGN PATENT DOCUMENTS

| KR | 10-2003-0043190 A | 6/2003 |
|---|---|---|
| KR | 10-2005-0082810 A | 8/2005 |
| KR | 10-2013-0123164 A | 11/2013 |
| KR | 10-2017-0003362 A | 6/2017 |
| KR | 10-1957875 B1 | 3/2019 |
| WO | 2017/130825 A1 | 8/2017 |

* cited by examiner

*Primary Examiner* — Gregory E Webb
(74) *Attorney, Agent, or Firm* — Novick, Kim & Lee PLLC; Jae Youn Kim

(57) ABSTRACT

A processing solution composition for reducing micro-bridge defects in a polyhydroxystyrene-containing photoresist pattern defined by an extreme-ultraviolet exposure source and a method of forming a pattern using the same are proposed. The processing solution composition includes 0.0001 to 1 wt % of an alkaline material, 0.0001 to 1 wt % of a nonionic surfactant having an HLB (Hydrophilic-Lipophilic Balance) value of 9 to 16, and 98 to 99.9998 wt % of water, reduces the number of micro-bridge defects in a polyhydroxystyrene-containing photoresist pattern defined by an extreme-ultraviolet exposure source, and has a low LWR (Line Width Roughness) value, thus effectively improving the uniformity of the pattern.

7 Claims, No Drawings

PROCESS LIQUID COMPOSITION FOR EXTREME ULTRAVIOLET LITHOGRAPHY AND PATTERN FORMING METHOD USING SAME

TECHNICAL FIELD

The present disclosure relates to a processing solution composition for reducing micro-bridge defects in a polyhydroxystyrene-containing photoresist pattern, suitable for use in extreme-ultraviolet lithography during a process of manufacturing a semiconductor, and to a method of forming a pattern using the composition.

BACKGROUND ART

In a process of manufacturing a semiconductor, in order to form a finer pattern, a light source of a smaller wavelength band is required. Currently, a lithography technology using an extreme-ultraviolet (EUV, 13.5 nm wavelength) light source is actively used, and a finer pattern may be realized using the same. However, as the pattern becomes increasingly fine, there is a problem in that the processing margin is greatly reduced in the manufacturing process due to small defects.

The types of defects generated during the photoresist lithography process using an extreme-ultraviolet light source may be broadly divided into two depending on the shape of the pattern.

In the first case, when the shape of the pattern is a line, many micro-bridge defects occur.

In the second case, when the shape of the pattern is a hole, many blob defects occur.

Accordingly, it is required to develop techniques for removing defects generated during the formation of a fine pattern. In order to reduce the incidence of defects, it may be ideal to improve the performance of the photoresist, but the reality that it is difficult to develop a novel photoresist that satisfies all performance aspects cannot be ignored.

Aside from the need to develop novel photoresists having excellent characteristics, efforts to reduce the incidence of defects in other ways are ongoing.

DISCLOSURE

Technical Problem

An objective of the present disclosure is to provide a processing solution composition for reducing the number of defects generated after photoresist development in a fine patterning process using extreme ultraviolet rays, and for decreasing LWR (Line Width Roughness).

Another objective of the present disclosure is to provide a method of forming a photoresist pattern having good quality using the processing solution composition described above.

Technical Solution

In order to solve the technical problem, the present disclosure is intended to provide a processing solution composition for reducing micro-bridge defects in a polyhydroxystyrene-containing photoresist pattern defined by an extreme-ultraviolet exposure source, through continuous research and experimentation based on the type, amount and HLB value of nonionic surfactant, the type and amount of alkaline material, and the amount of pure water.

The aqueous cleaning solution used during the development process may include a variety of surfactants, but in the present disclosure, based on the results of conducting various studies based on the value of HLB (Hydrophilic-Lipophilic Balance), an effective cleaning solution is prepared using a nonionic surfactant having an HLB value of 9 to 16.

The HLB value is a representative basis for distinguishing characteristics between nonionic surfactants. An HLB value falls in the range of 0 to 20. When the HLB value is closer to 0, the hydrophobic (lipophilic) property of the nonionic surfactant is strong, and when the HLB value is closer to 20, the hydrophilic property of the nonionic surfactant is strong.

When a nonionic surfactant that exhibits lipophilicity is added to an aqueous cleaning solution that mostly contains ultrapure water, there is a concern in that defects may be caused due to agglomeration of the nonionic surfactant during use because the physical properties of the cleaning solution are not uniform due to the strong tendency of the nonionic surfactant to agglomerate.

In the present disclosure, based on the results of performing thorough research and experimentation, it can be confirmed that defects occur when the HLB value of the nonionic surfactant is 8 or less.

In contrast, when using a nonionic surfactant that exhibits hydrophilicity, it may be uniformly dispersed without agglomeration in an aqueous cleaning solution that contains mostly ultrapure water to afford a cleaning solution having uniform physical properties, but there is a concern in that the affinity for the hydrophobic photoresist to be cleaned is poor, so the ability to remove defects and the ability to reduce LWR are insufficient.

In the present disclosure, based on the results of performing thorough research and experimentation, it can be confirmed that the ability to reduce LWR is insufficient when the HLB value of the nonionic surfactant is 17 or more.

A representative developer that is currently used in most photolithography development processes is configured to include mainly pure water and tetramethylammonium hydroxide diluted to a predetermined concentration. In most processes, a mixture of 2.38 wt % of tetramethylammonium hydroxide and 97.62 wt % of water is used, and even in the extreme-ultraviolet lithography process, the developer that is currently used includes pure water and diluted tetramethylammonium hydroxide.

In the present disclosure, pattern collapse is observed when cleaning with pure water alone after development during the extreme-ultraviolet lithography process.

Moreover, pattern collapse is observed even when a cleaning solution including pure water and tetramethylammonium hydroxide is applied after development during the extreme-ultraviolet lithography process, or even when a cleaning solution including pure water and tetramethylammonium hydroxide is applied after cleaning with pure water alone.

Based on these results, it is confirmed that, in the case of the cleaning solution including pure water and tetramethylammonium hydroxide, the pattern is destroyed by weakening the fine pattern exposed to extreme ultraviolet rays.

In the present disclosure, in order to reduce defects or LWR without collapse of the pattern exposed to extreme ultraviolet rays, due to the need to search for an alkaline material that has a relatively less influence on the pattern exposed to extreme ultraviolet rays than tetramethylammonium hydroxide, research and experimentation thereon have been continuously conducted.

In the present disclosure, it is confirmed that, when using tetraethylammonium hydroxide, tetrapropylammonium hydroxide, or tetrabutylammonium hydroxide, other than tetramethylammonium hydroxide, among alkaline materials, pattern collapse does not occur, but defects or LWR are reduced.

Therefore, a preferred first embodiment of the present disclosure provides a cleaning solution for reducing the incidence of defects after photoresist development, including 0.0001 to 1 wt % of an alkaline material, 0.0001 to 1 wt % of a nonionic surfactant having an HLB value of 9 to 16, and 98 to 99.9998 wt % of water.

In the above embodiment, the alkaline material may be selected from the group consisting of tetraethylammonium hydroxide, tetrapropylammonium hydroxide, tetrabutylammonium hydroxide, and mixtures thereof.

In the above embodiment, the surfactant may be a nonionic surfactant.

In the above embodiment, the nonionic surfactant may be selected from the group consisting of polyoxyethylene alkyl ether, polyoxypropylene alkyl ether, polyoxyethylene oxypropylene alkyl ether, and mixtures thereof.

In the above embodiment, the HLB value of polyoxyethylene alkyl ether, polyoxypropylene alkyl ether, or polyoxyethylene oxypropylene alkyl ether may fall in the range of 9 to 16.

In addition, the present disclosure provides a method of forming a photoresist pattern, including: (a) forming a photoresist film by applying a photoresist on a semiconductor substrate; (b) forming a photoresist pattern by exposing and developing the photoresist film; and (c) cleaning the photoresist pattern with the processing solution composition for photolithography described above.

Although various defects are generated during the formation of a photoresist pattern, the defects that account for the greatest portion of defects formed during the current extreme-ultraviolet lithography process are micro-bridge defects.

The cause of occurrence of micro-bridge defects has not been accurately identified yet, but the following causes are typically presumed.

1) It is presumed to be caused by failure to filter a precursor that may cause micro-bridge defects in the final filter (point-of-use) when a photoresist is sprayed through a nozzle.

2) It is presumed that some portions that are developed are present between the patterns due to excessive use of a photo-acid generator or a cross-linker among the components of the photoresist.

3) It is presumed that portions of the photoresist are made to protrude out of the pattern by the developer during development due to insufficient hardness.

Micro-bridge defects occurring due to various causes, in addition to the above presumed causes, strongly affect the yield of the final product, and therefore must be mitigated.

The processing solution of the present disclosure exhibits an excellent effect on a photoresist using an extreme-ultraviolet light source. In particular, there is a particular effect of reducing the incidence of defects after development of a photoresist in which the resin, which is the main component of the photoresist, is polyhydroxystyrene.

Advantageous Effects

According to the present disclosure, a processing solution composition for photolithography can help to form a polyhydroxystyrene-containing photoresist pattern defined by an extreme-ultraviolet exposure source. In particular, a simple process is added, whereby the number of micro-bridge defects in the pattern, which is difficult to form using a photoresist alone, can be reduced, and a low LWR value can result, thus effectively improving the uniformity of the pattern, thereby reducing production costs.

BEST MODE

Hereinafter, a detailed description will be given of the present disclosure.

The present disclosure pertains to a processing solution for reducing the incidence of defects after photoresist development, including 0.0001 to 1 wt % of an alkaline material, 0.0001 to 1 wt % of a nonionic surfactant having an HLB (Hydrophilic-Lipophilic Balance) value of 9 to 16, and 98 to 99.9998 wt % of water.

A better understanding of the present disclosure will be given through the following examples and comparative Examples. These examples are merely set forth to illustrate the present disclosure, and are not to be construed as limiting the scope of the present disclosure.

MODE FOR DISCLOSURE

Examples and Comparative Examples

Example 1

A processing solution for reducing the incidence of defects in a photoresist pattern, including 0.0001 wt % of polyoxyethylene alkyl ether having an HLB value of 12 and 0.0001 wt % of tetrabutylammonium hydroxide, was prepared as follows.

0.0001 wt % of polyoxyethylene alkyl ether having an HLB value of 12 and 0.0001 wt % of tetrabutylammonium hydroxide were added to 99.9998 wt % of deionized (DI) water, stirred for 5 hr, and passed through a 0.02 μm filter to remove fine solid impurities, thereby preparing a processing solution for reducing the incidence of defects in a photoresist pattern.

Example 2 to Example 16

Respective processing solutions for reducing the incidence of defects in a photoresist pattern were prepared in the same manner as in Example 1 using components in the amounts shown in Tables 1 to 5 below.

Comparative Example 1

Pure water (DI water), which is typically used as the final processing solution of the development process in the process of manufacturing a semiconductor device, was prepared.

Comparative Example 2 to Comparative Example 9

For comparison with Examples, respective processing solutions were prepared in the same manner as in Example 1, using components in the amounts shown in Tables 1 to 5 below.

TABLE 1

|  | Surfactant | | | Alkaline material | | DI water | |
| --- | --- | --- | --- | --- | --- | --- | --- |
|  | Name | HLB | Amount (wt %) | Name | Amount (wt %) | Name | Amount (wt %) |
| Example 1 | Polyoxyethylene alkyl ether | 12 | 0.0001 | Tetrabutylammonium hydroxide | 0.0001 | DI water | 99.9998 |
| Example 2 | Polyoxyethylene alkyl ether | 12 | 0.01 | Tetrabutylammonium hydroxide | 0.0001 | DI water | 99.9989 |
| Example 3 | Polyoxyethylene alkyl ether | 12 | 1 | Tetrabutylammonium hydroxide | 0.0001 | DI water | 98.9999 |
| Comparative Example 1 | — | — | — | — | — | DI water | 100 |
| Comparative Example 2 | — | — | — | Tetrabutylammonium hydroxide | 0.0001 | DI water | 99.9999 |
| Comparative Example 3 | Polyoxyethylene alkyl ether | 12 | 2 | Tetrabutylammonium hydroxide | 0.0001 | DI water | 97.9999 |

TABLE 2

|  | Surfactant | | | Alkaline material | | DI water | |
| --- | --- | --- | --- | --- | --- | --- | --- |
|  | Name | HLB | Amount (wt %) | Name | Amount (wt %) | Name | Amount (wt %) |
| Example 4 | Polyoxyethylene alkyl ether | 12 | 0.01 | Tetrabutylammonium hydroxide | 0.01 | DI water | 99.9800 |
| Example 5 | Polyoxyethylene alkyl ether | 12 | 0.01 | Tetrabutylammonium hydroxide | 1 | DI water | 98.9900 |
| Comparative Example 4 | Polyoxyethylene alkyl ether | 12 | 0.01 | — | — | DI water | 99.9900 |
| Comparative Example 5 | Polyoxyethylene alkyl ether | 12 | 0.01 | Tetrabutylammonium hydroxide | 2 | DI water | 97.9900 |

TABLE 3

|  | Surfactant | | | Alkaline material | | DI water | |
| --- | --- | --- | --- | --- | --- | --- | --- |
|  | Name | HLB | Amount (wt %) | Name | Amount (wt %) | Name | Amount (wt %) |
| Example 6 | Polyoxyethylene alkyl ether | 9 | 0.01 | Tetrabutylammonium hydroxide | 0.01 | DI water | 99.9800 |
| Example 7 | Polyoxyethylene alkyl ether | 10 | 0.01 | Tetrabutylammonium hydroxide | 0.01 | DI water | 99.9800 |
| Example 8 | Polyoxyethylene alkyl ether | 11 | 0.01 | Tetrabutylammonium hydroxide | 0.01 | DI water | 99.9800 |
| Example 9 | Polyoxyethylene alkyl ether | 13 | 0.01 | Tetrabutylammonium hydroxide | 0.01 | DI water | 99.9800 |
| Example 10 | Polyoxyethylene alkyl ether | 14 | 0.01 | Tetrabutylammonium hydroxide | 0.01 | DI water | 99.9800 |
| Example 11 | Polyoxyethylene alkyl ether | 15 | 0.01 | Tetrabutylammonium hydroxide | 0.01 | DI water | 99.9800 |
| Example 12 | Polyoxyethylene alkyl ether | 16 | 0.01 | Tetrabutylammonium hydroxide | 0.01 | DI water | 99.9800 |
| Comparative Example 6 | Polyoxyethylene alkyl ether | 8 | 0.01 | Tetrabutylammonium hydroxide | 0.01 | DI water | 99.9800 |
| Comparative Example 7 | Polyoxyethylene alkyl ether | 17 | 0.01 | Tetrabutylammonium hydroxide | 0.01 | DI water | 99.9800 |

TABLE 4

| | Surfactant | | | Alkaline material | | DI water | |
|---|---|---|---|---|---|---|---|
| | Name | HLB | Amount (wt %) | Name | Amount (wt %) | Name | Amount (wt %) |
| Example 13 | Polyoxypropylene alkyl ether | 12 | 0.01 | Tetrabutylammonium hydroxide | 0.01 | DI water | 99.9800 |
| Example 14 | Polyoxyethylene oxypropylene alkyl ether | 12 | 0.01 | Tetrabutylammonium hydroxide | 0.01 | DI water | 99.9800 |

TABLE 5

| | Surfactant | | | Alkaline material | | DI water | |
|---|---|---|---|---|---|---|---|
| | Name | HLB | Amount (wt %) | Name | Amount (wt %) | Name | Amount (wt %) |
| Example 15 | Polyoxyethylene alkyl ether | 12 | 0.01 | Tetraethylammonium hydroxide | 0.01 | DI water | 99.9800 |
| Example 16 | Polyoxyethylene alkyl ether | 12 | 0.01 | Tetrapropylammonium hydroxide | 0.01 | DI water | 99.9800 |
| Comparative Example 8 | Polyoxyethylene alkyl ether | 12 | 0.01 | Tetrapentylammonium hydroxide | 0.01 | DI water | 99.9800 |
| Comparative Example 9 | Polyoxyethylene alkyl ether | 12 | 0.01 | Tetramethylammonium hydroxide | 0.01 | DI water | 99.9800 |

Test Examples and Comparative Test Examples

The pattern, formed by applying a photoresist on a semiconductor substrate to form a photoresist film and exposing and developing the photoresist film to form a pattern, was cleaned using the processing solution composition of each of Example 1 to Example 16 and Comparative Example 1 to Comparative Example 9, after which the silicon wafer having the pattern formed thereon was measured for the defect number reduction ratio, LWR, and pattern collapse. The results thereof are shown as Test Example 1 to Test Example 16 and Comparative Test Example 1 to Comparative Test Example 9 in Table 6 below.

(1) Micro-Bridge Defect Number Ratio

For the photoresist pattern rinsed with each rinse solution sample using a surface defect observation device [KLA, Tencor], the number of micro-bridge defects (A) was measured and expressed as a percentage (%) of the number of defects (B) observed upon rinsing with pure water alone, that is, (AB)×100.

The number of defects after treatment with pure water was set to 100% as a standard, and the extent of decrease or increase is expressed as a percentage compared to 100%, as the number of defects when treated with pure water alone, which is referred to as the micro-bridge defect number ratio (decrease or increase ratio). Here, a lower value is judged to be better.

(2) LWR

Using a critical dimension-scanning electron microscope (CD-SEM, Hitachi), the difference between the widest portion and the narrowest portion of the pattern was measured to determine the LWR value. The smaller the LWR value, the more uniform the pattern.

The LWR value of the pattern treated with pure water alone was determined to be 5.9, and when the LWR was reduced using the prepared cleaning solution, it appears as a value lower than 5.9, and when it is deteriorated, it appears as a value higher than 5.9.

(3) Pattern Collapse

Using a critical dimension-scanning electron microscope (CD-SEM, Hitachi) and a scanning electron microscope (FE-SEM, Hitachi), whether the pattern collapsed was observed.

When there is no pattern collapse, it is indicated as 0, whereas, when there is a pattern collapse, it is indicated by X, and pattern collapse is judged to be poor regardless of any reduction in the number of defects or LWR.

TABLE 6

| | Micro-bridge defect number ratio (%) | LWR (nm) | Pattern collapse |
|---|---|---|---|
| Example 1 | 75 | 5.5 | ○ |
| Example 2 | 55 | 5.2 | ○ |
| Example 3 | 82 | 5.1 | ○ |
| Example 4 | 9 | 4.7 | ○ |
| Example 5 | 15 | 4.5 | ○ |
| Example 6 | 72 | 5.8 | ○ |
| Example 7 | 58 | 4.6 | ○ |
| Example 8 | 29 | 4.5 | ○ |
| Example 9 | 12 | 4.6 | ○ |
| Example 10 | 15 | 5.0 | ○ |
| Example 11 | 19 | 5.3 | ○ |
| Example 12 | 20 | 5.7 | ○ |
| Example 13 | 15 | 4.9 | ○ |
| Example 14 | 13 | 5.0 | ○ |
| Example 15 | 15 | 4.0 | ○ |
| Example 16 | 12 | 4.8 | ○ |
| Comparative Example 1 | 100 | 5.9 | X |
| Comparative Example 2 | 90 | 6.0 | X |
| Comparative Example 3 | 112 | 5.3 | X |
| Comparative Example 4 | 60 | 6.3 | ○ |
| Comparative Example 5 | 132 | 5.8 | ○ |
| Comparative Example 6 | 182 | 6.4 | ○ |
| Comparative Example 7 | 81 | 6.1 | ○ |
| Comparative Example 8 | 33 | 6.2 | ○ |
| Comparative Example 9 | 17 | 4.3 | X |

○: No pattern collapse
X: Pattern collapse

Based on the results of comparison of Test Examples 1 to 3 with Comparative Test Examples 1 to 3, when the concentration of the surfactant was 0.0001 to 1 wt %, the number of micro-bridge defects was decreased, the LWR value was low and thus the uniformity of the pattern was improved, and there was no pattern collapse.

Based on the results of comparison of Test Examples 2, 4 and 5 with Comparative Test Examples 1, 4 and 5, when the concentration of the alkaline material was 0.0001 to 1 wt %, the number of micro-bridge defects was decreased, the LWR value was low and thus the uniformity of the pattern was improved, and there was no pattern collapse.

Based on the results of comparison of Test Examples 4 and 6 to 12 with Comparative Test Examples 1, 6 and 7, when the HLB value was 9 to 16, the number of micro-bridge defects was decreased, the LWR value was low and thus the uniformity of the pattern was improved, and there was no pattern collapse. In particular, when the HLB value was 12 to 16, vastly superior effects were exhibited.

Based on the results of comparison of Test Examples 4, 13 and 14 with Comparative Test Example 1, when the surfactant was polyoxyethylene alkyl ether, polyoxypropylene alkyl ether, or polyoxyethylene oxypropylene alkyl ether, the number of micro-bridge defects was decreased, the LWR value was low and thus the uniformity of the pattern was improved, and there was no pattern collapse. In particular, when the surfactant was polyoxyethylene alkyl ether, vastly superior effects were exhibited.

Based on the results of comparison of Test Examples 4, 15 and 16 with Comparative Test Examples 1, 8 and 9, when the alkaline material was tetraethylammonium hydroxide, tetrapropylammonium hydroxide, or tetrabutylammonium hydroxide, the number of micro-bridge defects was decreased, the LWR value was low and thus the uniformity of the pattern was improved, and there was no pattern collapse. In particular, when the alkaline material was tetrabutylammonium hydroxide, vastly superior effects were exhibited.

Although specific embodiments of the present disclosure have been disclosed in detail above, it will be obvious to those skilled in the art that the description is merely of preferable exemplary embodiments and is not to be construed to limit the scope of the present disclosure. Therefore, the substantial scope of the present disclosure will be defined by the appended claims and equivalents thereof.

The invention claimed is:

1. A method of forming a photoresist pattern, comprising:
   (a) forming a photoresist film by applying a photoresist on a semiconductor substrate;
   (b) forming a photoresist pattern by exposing and developing the photoresist film; and
   (c) cleaning the photoresist pattern with a processing solution composition for photolithography,
      wherein the processing solution composition for reducing micro-bridge defects in a polyhydroxystyrene-containing photoresist pattern defined by an extreme-ultraviolet exposure source comprises:
         0.0001 to 1 wt % of a nonionic surfactant having an HLB (Hydrophilic-Lipophilic Balance) value of 9 to 16;
         0.0001 to 1 wt % of an alkaline material; and
         98 to 99.9998 wt % of water.

2. The method of claim 1, wherein the exposing is performed using an extreme-ultraviolet exposure source.

3. The method of claim 1, wherein the nonionic surfactant is selected from the group consisting of polyoxyethylene alkyl ether, polyoxypropylene alkyl ether, polyoxyethylene oxypropylene alkyl ether, and mixtures thereof.

4. The method of claim 1, wherein the nonionic surfactant is polyoxyethylene alkyl ether.

5. The method of claim 1, wherein the HLB value of the nonionic surfactant is in a range of 12 to 16.

6. The method of claim 1, wherein the alkaline material is selected from the group consisting of tetraethylammonium hydroxide, tetrapropylammonium hydroxide, tetrabutylammonium hydroxide, and mixtures thereof.

7. The method of claim 1, wherein the alkaline material is tetrabutylammonium hydroxide.

\* \* \* \* \*